(12) United States Patent
Levy et al.

(10) Patent No.: US 9,306,094 B2
(45) Date of Patent: Apr. 5, 2016

(54) SYSTEM AND METHOD FOR BLACK SILICON ETCHING UTILIZING THIN FLUID LAYERS

(71) Applicants: David Howard Levy, Rochester, NY (US); Theodore Zubil, Honeoye Falls, NY (US); Richard W. Topel, Jr., Rochester, NY (US); Wendy G. Ahearn, Rochester, NY (US)

(72) Inventors: David Howard Levy, Rochester, NY (US); Theodore Zubil, Honeoye Falls, NY (US); Richard W. Topel, Jr., Rochester, NY (US); Wendy G. Ahearn, Rochester, NY (US)

(73) Assignee: Natcore Technology, Inc., Rochester, NY (US)

( * ) Notice: Subject to any disclaimer, the term of this patent is extended or adjusted under 35 U.S.C. 154(b) by 0 days.

(21) Appl. No.: 14/467,422

(22) Filed: Aug. 25, 2014

(65) Prior Publication Data

US 2015/0056818 A1 Feb. 26, 2015

Related U.S. Application Data

(60) Provisional application No. 61/869,409, filed on Aug. 23, 2013.

(51) Int. Cl.
| | |
|---|---|
| H01L 31/0236 | (2006.01) |
| H01L 31/18 | (2006.01) |
| H01L 21/02 | (2006.01) |
| H01L 21/306 | (2006.01) |
| H01L 21/3213 | (2006.01) |
| H01L 21/67 | (2006.01) |
| H01L 31/0224 | (2006.01) |
| H01L 31/068 | (2012.01) |

(52) U.S. Cl.
CPC .... *H01L 31/02363* (2013.01); *H01L 21/02019* (2013.01); *H01L 21/30604* (2013.01); *H01L 21/32134* (2013.01); *H01L 21/6704* (2013.01); *H01L 21/6708* (2013.01); *H01L 21/67051* (2013.01); *H01L 31/0236* (2013.01); *H01L 31/022425* (2013.01); *H01L 31/068* (2013.01); *H01L 31/1804* (2013.01); *Y02P 70/521* (2015.11)

(58) Field of Classification Search
None
See application file for complete search history.

(56) References Cited

U.S. PATENT DOCUMENTS

| | | | |
|---|---|---|---|
| 2,652,759 A | | 9/1953 | Bornemann |
| 5,455,062 A | * | 10/1995 | Muhlfriedal et al. ............. 427/8 |
| 5,965,209 A | * | 10/1999 | Komatsu ............... B05C 5/0266 118/410 |
| 6,120,784 A | | 9/2000 | Snyder, Jr. |
| 6,200,909 B1 | | 3/2001 | Torek et al. |

(Continued)

OTHER PUBLICATIONS

J.P. Lee, S. Choi, and S. Park, "Extreamely Superhydrophobic Surface with Micro- and Nanostructures Fabricated by Copper Catalytic Etching", Langmuir, vol. 27, year 2011, pp. 809-814.*

(Continued)

*Primary Examiner* — Jiong-Ping Lu
(74) *Attorney, Agent, or Firm* — Winstead PC

(57) ABSTRACT

Systems and methods for etching the surface of a substrate may utilize a thin layer of fluid to etch a substrate for improved anti-reflective properties. The substrate may be secured with a holding fixture that is capable of positioning the substrate. A fluid comprising an acid and an oxidizer for etching may be prepared, which may optionally include a metal catalyst. An amount of fluid necessary to form a thin layer contacting the surface of the substrate to be etched may be dispensed. The fluid may be spread into the thin layer utilizing a tray that the substrate is dipped into, a plate that is placed near the surface of the substrate to be etched, or a spray or coating device.

8 Claims, 7 Drawing Sheets

(56) References Cited

U.S. PATENT DOCUMENTS

| | | | |
|---|---|---|---|
| 6,524,490 B1 | 2/2003 | Grunwald | |
| 6,790,785 B1* | 9/2004 | Li et al. | 438/745 |
| 2003/0119332 A1* | 6/2003 | Kuebelbeck et al. | 438/753 |
| 2003/0196986 A1* | 10/2003 | Tsung-Kuei et al. | 216/2 |
| 2004/0065540 A1* | 4/2004 | Mayer | C23C 18/1619 204/198 |
| 2007/0199642 A1 | 8/2007 | Natarajan | |
| 2009/0053894 A1* | 2/2009 | Koyata et al. | 438/691 |
| 2010/0003878 A1 | 1/2010 | Ahluwalia | |
| 2012/0178204 A1* | 7/2012 | Toor et al. | 438/71 |

OTHER PUBLICATIONS

Int'l Search Report for PCT/US2014/052495, Nov. 6, 2014.

\* cited by examiner

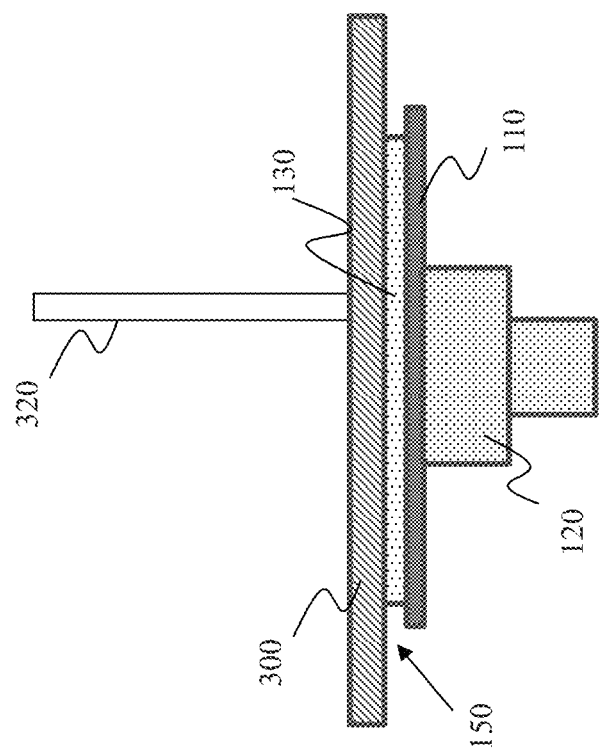
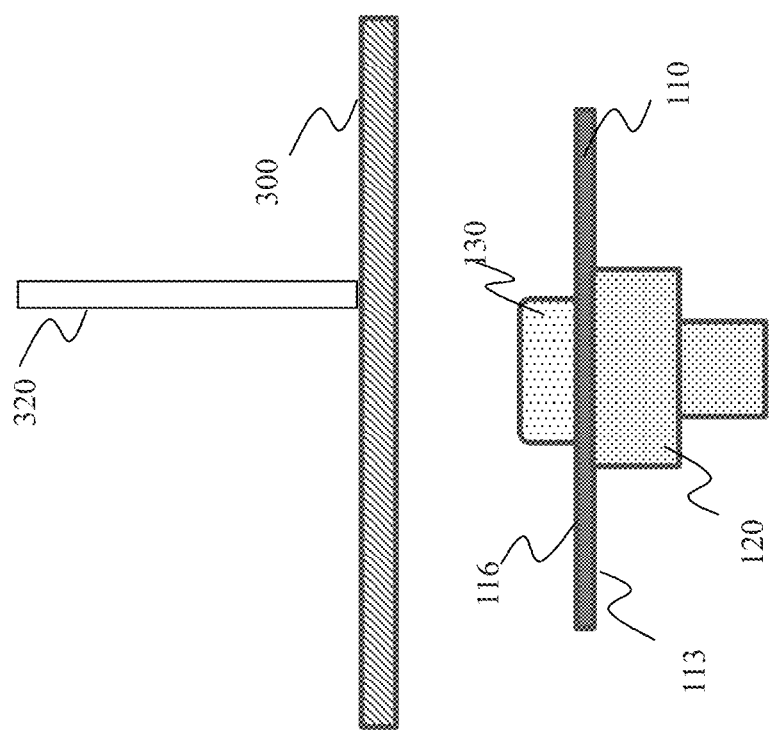
FIG. 3a
FIG. 3b

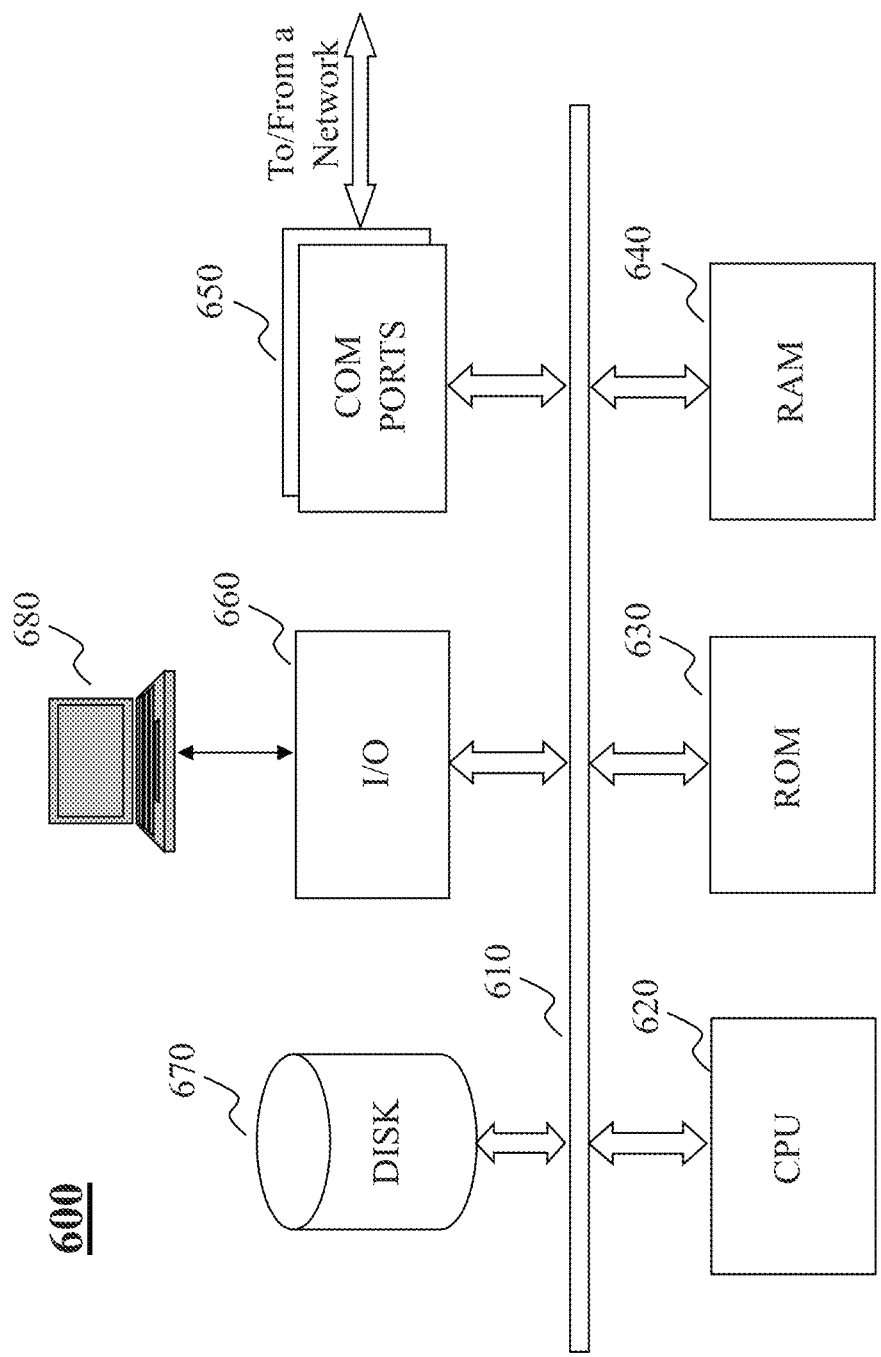

SYSTEM AND METHOD FOR BLACK SILICON ETCHING UTILIZING THIN FLUID LAYERS

RELATED APPLICATIONS

This application claims the benefit of U.S. Provisional Patent Application No. 61/869,409 to Levy et al., filed on Aug. 23, 2013, which is incorporated herein by reference.

FIELD OF THE INVENTION

The present disclosure relates generally to a system and methods for surface etching of silicon. More specifically, the present disclosure relates to systems and methods for black silicon etching utilizing thin fluid layers.

BACKGROUND OF INVENTION

Exploitation of renewable energy, such as solar energy and the development of improved solar technology are of great interest in today's energy hungry world. Currently, industrial solar cells typically yield only 17% efficiency. The level of efficiency may be due reflection of light from the cell surface, due to the inherently high refractive index of silicon. The loss due to reflection can reach more than 40-45%, resulting in a low photoelectric conversion efficiency. Solar cells composed of silicon with no treatment of the light absorptive surface reflect approximately ⅓ of the incident light. This light is therefore wasted in the production of electricity from the solar cell.

It would therefore be desirable to make silicon wafers or substrates used in most solar cells more light absorptive to increase energy conversion efficiency. Black silicon refers to silicon surfaces or silicon-based films (including surface or film of silicon compound) that have high light absorptive surfaces. Compared to normal untreated silicon material the goal of black silicon is to have strong light absorption properties. It has been found that if black silicon is applied to optical sensor or solar cell the reflection of light from the cell surface can be reduced below 5%, often below 2%, increasing the efficiency of light sensing and absorption, and the conversion efficiency of solar cell can be markedly improved.

Prior teachings for producing low reflectance silicon have involved complex and often expensive manufacturing techniques and/or equipment. In some methods, the reflection reduction is not uniform across the spectrum of light incident on the solar cell. Some methods require multiple steps and multiple solutions. Further, some nanoscale texturing requires very precise etching. If the etching is not sufficient or precise, then the black silicon effect will not be realized and the reflectivity of the silicon surface will remain too high for practical use. Contrastingly, over-etching leads to (a) increased surface defects; and (b) the possibility of destroying existing structures on the surface of the silicon such as emitter junctions. Accordingly, the etching must be very uniform to ensure that all areas of the wafer are etched to the same extent, otherwise a silicon wafer or substrate may contain areas that are over- and/or under-etched. This requirement becomes even more challenging when the uniformity must occur over larger wafers such as the 125 mm or 156 mm square wafers used in current solar cell manufacturing.

Nanoscale structure etching processes are very sensitive to local fluid flows during the etching process. Further, it has been found that natural variations in flow caused by convection and substrate edges lead to an unacceptable variation in etching across, such as with a typical 125 mm silicon wafer. Some methods utilize a large volume of fluid with the substrate completely immersed in the fluid. These methods may result in poor fluid flow, concentration build ups, and/or other local fluid flow problems because the fluid may not flow evenly between the substrates and over their surfaces. These "bath" or "tank" processes are wasteful because they necessarily provide extra fluid beyond that which is in direct in contact with the wafer. Further, such methods are imprecise because of the improper flow, micro-currents within the baths, improper mixing, settling of reagents, etc. Such processes inherently cause non-uniformity. While intentional mixing of the volume to counteract some of the abovementioned effects can be accomplished with mechanical means such as stirring, substrate movement, or sonication, these methods cannot ensure uniform mixing across an entire wafer.

Accordingly, a need exists for a manufacturing process for etching silicon wafers that is precise, easy to implement in a manufacturing environment, provides controllability and uniformity in etching across the surface of the wafer, and does not require and waste large quantities of reagent fluid. The present disclosure addresses and overcomes the hereto prior problems.

SUMMARY OF INVENTION

In an embodiment, a method for etching the surface of a substrate is disclosed. The method comprises retaining the substrate in a holder or holding fixture that is capable of positioning the substrate. In some embodiments, a fluid comprising an acid and an oxidizer for etching may be prepared, which may optionally include a metal catalyst. The fluid dispensed is limited to an amount necessary to form a thin layer contacting the surface of the substrate. In some embodiments, the fluid may be dispensed and/or spread by capillary forces. In some embodiments, the fluid may be spread to form a layer with a thickness or depth of about 0 to 5 mm. In some embodiments, the fluid may be spread utilizing a tray that the substrate is dipped into, a plate that is placed near the surface of the substrate to be etched, a spray or coating device, or the like. In some embodiments, the fluid is in contact with the substrate for about 10 seconds to 5 minutes.

In some embodiments, a system for etching the surface of a substrate may comprise a substrate, holding fixture, fluid dispenser, and dispersion mechanism. The holding fixture may secure the substrate in a desired position. In some embodiments, the holding fixture may maintain a fixed position or may be movable to adjust the position of the substrate. The fluid dispenser may prepare and/or provide a fluid comprising an acid and an oxidizer for etching, which may optionally include a metal catalyst. In some embodiments, the dispersion mechanism may be movable or may remain in a fixed position. In some embodiments, the dispersion mechanism may be a tray for receiving the dispensed fluid, and fluid may be spread by maintaining a desired distance gap between the substrate and the tray. In some embodiments, the dispersion mechanism may be a plate and the fluid may be spread by maintaining a desired distance gap between the substrate and the plate. In some embodiments, the dispersion mechanism may be a sprayer, coating device, or the like.

The foregoing has outlined rather broadly various features of the present disclosure in order that the detailed description that follows may be better understood. Additional features and advantages of the disclosure will be described hereinafter.

BRIEF DESCRIPTION OF THE DRAWINGS

The methods and systems described herein are further described in terms of exemplary embodiments. These exemplary embodiments are described in detail with reference to the drawings. These embodiments are non-limiting exemplary embodiments, in which like reference numerals represent similar structures throughout the several views of the drawings, and wherein:

FIGS. 3a-b depict a system for inverted etching of a substrate;

FIG. 6 depicts a general computer architecture on which the present teaching can be implemented.

DETAILED DESCRIPTION

Figure 1A:
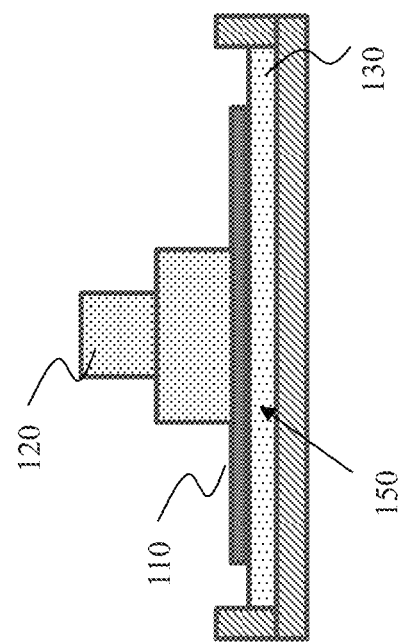
FIGS. 1a-b depict a system for etching a substrate utilizing a container.

Refer now to the drawings wherein depicted elements are not necessarily shown to scale and wherein like or similar elements are designated by the same reference numeral through the several views.

Referring to the drawings in general, it will be understood that the illustrations are for the purpose of describing particular implementations of the disclosure and are not intended to be limiting thereto. While most of the terms used herein will be recognizable to those of ordinary skill in the art, it should be understood that when not explicitly defined, terms should be interpreted as adopting a meaning presently accepted by those of ordinary skill in the art.

It is to be understood that both the foregoing general description and the following detailed description are exemplary and explanatory only, and are not restrictive of the invention, as claimed. In this application, the use of the singular includes the plural, the word "a" or "an" means "at least one", and the use of "or" means "and/or", unless specifically stated otherwise. Furthermore, the use of the term "including", as well as other forms, such as "includes" and "included", is not limiting. Also, terms such as "element" or "component" encompass both elements or components comprising one unit and elements or components that comprise more than one unit unless specifically stated otherwise.

System and methods for black silicon etching discussed herein may utilize a thin fluid layer to minimize local fluid flow, poor mixing, and waste. The thin fluid layer may be applied to a substrate utilizing various methods. As nonlimiting examples, a silicon substrate may be dipped-in to a thin fluid layer, the fluid may be placed on top of the substrate along with a plate to aid dispersion of the fluid into a thin layer, or the fluid may be carefully spread or dispersed on the surface of the substrate to form a thin layer. It has been found that the abovementioned problems in the art may be solved by a number of approaches that utilize thin films of fluid in the proximity of the wafer surface. These new and innovative approaches may be categorized as a fluid containment between opposing surfaces or a fluid containment with a free (air) surface.

In an embodiment the fluid is confined to a small space thereby eliminating the possibility of any significant fluid motion or micro-currents. Additionally, in such an embodiment, etching may only occur on one side of the substrate. For black silicon cells, this is a strong advantage since it is undesirable to have a black surface on both sides of the cell in some cell designs.

Another advantage of the approaches disclosed herein is that fresh solution may be used for each wafer or substrate. In the case that an etch solution is composed of several components that cannot be exposed to each other for extended periods of time (i.e. poor solution lifetime), mixing of those components can occur just prior to the etching step, which cannot be done easily with a tank process especially since solution loaded in a tank process is typically used for several batches of wafers or substrates.

In some embodiments, a method for anti-reflective etching the surface of a substrate may include one or more of the following steps. The substrate may be secured with a holding fixture that controls positioning of the substrate. A fluid may be prepared that comprises an acid and an oxidizer. In some embodiments, the fluid may also include a metal catalyst. In such embodiments that include a metal catalyst, the anti-reflective etching process may be referred to as a single-stage process because a single etching stage with such fluid with the metal catalyst completes the anti-reflective etching. The fluid may be dispensed and may contact the substrate after being dispensed. The fluid may also be spread or dispersed onto the substrate into a thin layer for a predetermined time. This dispersion forms a thin layer of the fluid that contacts a first surface of the substrate. Fluid may refer to any fluid utilized during the anti-reflective etching process, including fluids utilized to deposit a metal catalyst in one stage of a multi-stage etching process or any other fluids utilized in any stage of a multi-stage etching process. This anti-reflective etching causes the first surface of the substrate to be texturized to reduce reflectivity. It will be apparent to one of ordinary skill in the art that a fluid dispenser may prepare and/or provide one or more fluids to be utilized in the etching process to a desired location. In some embodiments, such a fluid dispenser may also serve as a dispersion mechanism. A dispersion mechanism may spread out or disperse the one or more fluids utilized in the etching process to cover the entire surface to be treated or etched. The dispersion mechanism may also maintain the fluid in contact with that surface during the entirety of the treatment or etching time. As a nonlimiting example, the dispersion mechanism may be a tray or plate that a substrate is placed in close proximity to cause the fluid to spread out and cover a desired surface. As another nonlimiting example, the dispersion mechanism may be a nozzle, sprayer, or the like combined with the use of a fluid with properties (e.g. viscosity, surface tension, etc.) that ensure the fluid will spread out and coat a desired surface. As a result of dispensing/dispersion and exposure to the fluid(s), the surface of the substrate that was in contact with the fluid(s) is anti-reflectively etched or texturized to provide reduced reflectivity.

The thin layer of fluid minimizes or eliminates microcurrents that can cause inconsistency in the etching process and also minimizes the amount of fluid needed for etching. In some embodiments, the thin layer of fluid may only contact the first surface of the substrate or may only inconsequentially contact a small portion of surfaces other than the first surface. Once etching is complete, the thin layer of fluid is removed from contact with the substrate. In some embodiments, the fluid is dispersed or spread out into the thin layer with a thickness of 5 mm or less. In other embodiments, the fluid is dispersed or spread out into the thin layer with a thickness of 1.5 mm or less. A thickness of the thin layer of fluid is controlled by controlling a separation distance between the first surface of the substrate and an opposing surface of a dispersion mechanism opposite the first surface. In some embodiments, the dispersion mechanism may be a tray, and the fluid is dispersed or spread out by positioning the first surface of the substrate a predetermined distance from a bottom surface of the tray. In some embodiments, the dispersion mechanism may be a plate, and the fluid is dispersed or spread out by positioning the plate a predetermined distance from the first surface of the substrate. In some embodiments, the dispensing and dispersion steps may be combined and provided by a dispensing or dispersion mechanism. For example, dispensing or dispersion mechanism may be spray-on or coating mechanism, such as a mechanism for blade coating, bead coating, curtain coating, nozzle spray coating, or ultrasonic atomization spray coating. In some embodiments, the fluid further comprises a metal catalyst. In some embodiments, components of the fluid are mixed in an inline manner prior to the dispensing step. The fluid may remain in contact with the substrate for about 10 second to 5 minutes for the anti-reflective etching process. In some embodiments, the fluid is dispersed and/or dispensed by capillary forces. In some embodiments, the substrate is masked prior to the anti-reflective etching to prevent etching in undesired regions of the substrate.

In some embodiments, the anti-reflective etching process may be a multi-stage process that includes: a catalytic metal deposition stage to deposit a metal on the substrate, and an etching stage that texturizes surface(s) of the substrate to reduce reflectivity. In some embodiments, the catalytic metal deposition stage may occur utilizing a thin layer fluid process that includes steps similar to the etching stage as discussed further herein. In some embodiments, the catalytic metal may exist in a deposition fluid as a precursor that is reduced or plated on the substrate surface. As a nonlimiting example, preferred catalytic metal solutions contain a catalytic metal and a fluorine containing compound, such as hydrofluoric acid, that is dispensed and/or dispersed into a thin fluid layer on the substrate to deposit the catalytic metal on the substrate. In some embodiments, the deposition fluid is dispersed or spread out into the thin layer with a thickness of 5 mm or less. In other embodiments, the deposition fluid is dispersed or spread out into the thin layer with a thickness of 1.5 mm or less. A thickness of the thin layer of deposition fluid is controlled by controlling a separation distance between the first surface of the substrate and an opposing surface of a dispersion mechanism opposite the first surface. In some embodiments, the dispersion mechanism may be a tray, and the deposition fluid is dispersed or spread out by positioning the first surface of the substrate a predetermined distance from a bottom surface of the tray. In some embodiments, the dispersion mechanism may be a plate, and the deposition fluid is dispersed or spread out by positioning the plate a predetermined distance from the first surface of the substrate. In some embodiments, the dispensing and dispersion steps may be combined and provided by a dispensing or dispersion mechanism. For example, dispensing or dispersion mechanism may be spray-on or coating mechanism, such as a mechanism for blade coating, bead coating, curtain coating, nozzle spray coating, or ultrasonic atomization spray coating. In some embodiments, components of the deposition fluid are mixed in an inline manner prior to the dispensing step. The deposition fluid may remain in contact with the substrate for about 5 seconds to 5 minutes for the catalytic metal deposition stage. In some embodiments, the deposition fluid is dispersed and/or dispensed by capillary forces. After the catalytic metal deposition stage, the metal catalyst has been deposited on portions of the substrate, and the anti-reflective etching process may proceed to the etching stage to texturize the surface of the substrate where the metal catalyst was deposited on the substrate. This etching stage may proceed in the same manner as discussed above for a single-stage etching process. However, it should be recognized that catalytic metal is not necessary in a thin etching fluid layer during this etching stage since the catalytic metal has been previously deposited on the substrate. Although, in some cases, it may be desirable to still include the catalytic metal in the fluid during the etching stage to further improve etching.

In some embodiments, a system for anti-reflective etching, such as for performing the abovementioned or other anti-reflective etching methods discussed herein, may comprise a holding fixture for securing and positioning a substrate, a fluid comprising an acid and an oxidizer, a dispensing mechanism for dispensing the fluid, and a dispersion mechanism, wherein the dispersion mechanism is movable to disperse or spread out the fluid into a thin layer contacting a first surface of the substrate for a predetermined period of time. In some embodiments, the dispensing mechanism may be nozzles, tubes, conduits, sprayers, doctor blade, printers, and/or the like. In some embodiments, the dispersion mechanism is a tray containing the fluid, and the fluid is dispersed or spread out by positioning the first surface of the substrate a predetermined distance from a bottom surface of the tray. In some embodiments, the dispersion mechanism is a plate, and the fluid is dispersed or spread out by positioning a plate a predetermined distance from the first surface of the substrate. In some embodiments, the dispensing or dispersion mechanism may be spray-on or coating mechanism, such as a mechanism for blade coating, bead coating, curtain coating, nozzle spray coating, or ultrasonic atomization spray coating.

FIG. 1 depicts an embodiment of an etching system 10 utilizing a dip-in process. The dip-in process may utilize a container that may be used to etch the surface of a silicon wafer or substrate used, for example, in a silicon solar cell. The etching system 10 may comprise a tray 100, substrate 110, holding fixture 120 and fluid 130.

In some embodiments, tray 100 serves as the dispersion mechanism. In some embodiment, tray 100 is sized to accommodate a single substrate 110. Tray 100 may be a standalone tray to etch a single silicon wafer or it may be a single tray in a series of trays used to simultaneously process numerous substrates. In an embodiment, tray 100 is part of a manufacturing assembly line process and may move along from station to station on a conveyor system or some other type of automated manufacturing process. Tray 100 may be comprised of a single piece or multiple pieces and may be composed of an inert material such as glass, plastic, metal, or any other inert material. Some plastics used in semiconductor manufacture such as Teflon®, polyvinylidene fluoride (PVDF), or perfluoroalkoxy polymer resins (PFA) have surfaces that do not allow even wetting by water. As a result, the surfaces of tray 100 may be optionally treated by chemical or physical means to render them partially wetting. Nonlimiting examples of such processes are ozone, corona discharge, or oxygen plasma exposures. In an embodiment, tray 100 may be stationary or may be movable. In an embodiment, tray 100 is sufficiently deep to contain a sufficient amount of fluid so as to contact an entire surface of the substrate 110 to be treated when it is inserted. Tray 100 should be a shallow tray that is deep enough to accommodate enough fluid to fully contact the substrate surface to be treated, but limited in depth so as to minimize or eliminate possible micro currents, settling, or other problems associated with immersion tanks. In an embodiment, tray 100 may be about 10 mm deep or less. In an embodiment, substrate 110 is a silicon wafer and may be used in solar cell manufacturing. In an embodiment, substrate 110 has a width of about 100 to 200 mm and preferably about 100 to 160 mm. It may be intended to be utilized as a single wafer or may by intended to be further broken down after etching into multiple wafers.

Holding fixture 120 is used to secure, position, and/or retain substrate 110. In some embodiments, holding fixture 120 is intended to be temporarily affixed to the back surface of substrate 110 such as a silicon wafer. Holding fixture 120 may comprise a single piece or multiple pieces and may be affixed in any number of ways. In an embodiment, holding fixture 120 utilizes mechanical means to affix to substrate 110 on the side of substrate 110 that is not to be etched. Such mechanical means may include, but are not limited to, fingers, clips, fasteners, claws, clamps, and retaining rings that may hold substrate 110 by the perimeter edges or retaining holes. In another embodiment, holding fixture 120 may be attached to the substrate 110 using a temporary adhesive, such as wax, glue, plastic, or paste. In another embodiment, holding fixture 120 may create a vacuum or other force between itself and the surface of substrate 110 to temporarily retain it. Holding fixture 120 may be sized to be used manually or may be part of an automated manufacturing process. In some embodiments, holding fixture 120 should be positionable to accurately and position and hold substrate 110 in contact with fluid 130 for the requisite period of time. In some embodiments, holding fixture 120 may be coupled to a positioning fixture (not shown), which is utilized to retain substrate 110 at the proper distance once placed into fluid 130. A positioning fixture may comprise an actuator, hydraulic actuator, mechanical actuator, or the like that allows holding fixture 120 to be moved to position the substrate 110 into fluid 130, as well as to control the separation distance of gap 150. In other embodiments, the holding fixture 120 may be secured in a fixed position during the dip-in process, whereas tray 100 is movable to control positioning of the substrate 110 in fluid 130 and/or the separation distance of gap 150.

Fluid 130 may be an etching fluid supplied for the black etching. In some embodiments, the substrate 110 may be treated prior to etching with a catalytic metal selected from at least one of gold, silver, copper, platinum, palladium, nickel, vanadium, rhodium, or the like. The catalytic metal may be in the form of a metal nanoparticle or a dissolved salt. In some embodiments, the etching solution may include an acid and an oxidizing agent. The etching solution may provide an acid that is preferably an inorganic acid and most preferably contains fluoride ion. The etching solution may contain an oxidizing agent such as hydrogen peroxide, nitric oxide, or dissolved oxygen. Exposure of the substrate 110 treated with the catalytic metal to the etching solution with the acid and oxidizing agent causes portions with deposits of the metal catalyst to be etched, whereas regions without metal catalyst are not etched. In some embodiment, etching may occur by sequential solution exposures, in which only the first solution contains the catalytic metal and subsequent solution exposures include the acid and/or oxidizing agent. It may be a single mixture fluid or may comprise multiple active ingredients.

In some embodiments, a single principle etching solution contains simultaneously a catalytic metal, an inorganic acid, and an oxidizing species. The catalytic metal is selected from at least one of gold, silver, copper, platinum, palladium, nickel, vanadium, rhodium, or the like. The catalytic metal may be in the form of a metal nanoparticle or a dissolved salt.

Fluid 130 may be pre-mixed or may be mixed/combined within tray 100. Tray 100 may have a dispensing mechanism, such as built in conduits or tubes through which fluid 130 may be supplied. In some embodiments, the conduits for supplying fluid 130 may be located near the center of tray 100 and allow fluid 130 to flow outwardly. Additionally and/or alternatively, fluid 130 may be supplied from one or more corners or one or more edges of tray 100 and may move into the tray by capillary action.

In some embodiments, the etching fluid may include a separate acidic compound and an oxidizing compound. In an embodiment, fluid 130 may include hydrofluoric acid (HF) as the acidic component, with concentrations in the range of about 0.1 to 10 M, and preferably about 1 to 5 M. In some embodiments, etching fluid may also include $H_2O_2$ as the oxidizing compound, with concentrations of about 0.1 to 10 M, and preferably 1 to 5 M. The temperature of the etching treatment can be about 10° C. to 50° C. The time of the etching treatment can be about 10 seconds to 5 minutes.

In an embodiment, it may be desirous to combine the catalyst deposition treatment and etching treatments into a single solution. Such a single solution is described in U.S. Pat. No. 8,075,792. The composition for a single solution nanoscale texturing may include a metal precursor, acidic compound, and an oxidizing compound. In an embodiment, a single solution nanoscale texturing may include silver nitrate at a concentration range of about 10 μM to 100 mM, and preferably about 10 μM to 20 mM; HF concentration range of about 0.1 to 10 M; and $H_2O_2$ concentration range of about 0.1 to 10 M. The temperature range of a single solution nano scale texturing during the etching step can be about 10° C. to 50° C. The time of the single solution nanoscale texturing can be between or equal to about 10 seconds to 5 minutes.

In some embodiments, fluid 130 may be part of a multi-step etching process, may only represent a single step in the multi-step etching process, and may less than all the components of the fluid. Thus, multiple stages of trays 100 and fluids 130 may be utilized during the multi-step etching process. As a nonlimiting example, HF may be utilized as the acid in the deposition of metal for metal assisted etching. In an embodiment, the HF concentration is about 0.01 to 1 molar, preferably about 0.05 to 0.5 molar. In an embodiment, the metal used in the deposition may be any metal that promotes localized etching. Non-limiting examples of metals that promote localized etching are silver, gold, copper and platinum. Exemplary metal precursors may include silver nitrate or gold chloride. In an embodiment, the concentration of the metal in the catalyst deposition solution can be about 10 μM to 20 mM, preferably about 0.2 mM to 10 mM. In an embodiment, the temperature of the catalyst deposition treatment can be about 10° C. to 50° C. The time of the catalyst deposition treatment can be 10 seconds to 5 minutes. After deposition of the metal catalyst, the nanoscale texturing is accomplished by exposing the substrate to any suitable liquid based etching formulation for which etching is enhanced in the vicinity of the metal catalyst nanoparticles.

As seen in FIG. 1a, tray 100 may be provided and filled with a small amount of fluid prior to the insertion of substrate 110. Substrate 110 may be held by holding fixture 120 from the sides or first surface 113 and is lowered into contact with fluid 130. Insertion of the substrate 110 into contact with fluid 130 should be accomplished in such a way that the liquid wets second surface 116 of substrate 110 with little or no inclusion of air bubbles. In an embodiment substrate 110 was inserted at an angle of about 20 to 60 degrees and preferably about 30-50 degrees. Once contacted, the substrate 110 should be lowered into the solution at a rate that does not induce significant flow. The rate of lowering the sample should be 5 to 25 degrees per second, preferably 8 to 20 degrees per second. A desired gap or distance 150 from the second surface 116 of substrate 110 to the interior surface of tray 100 has a distance of about 0 to 5 mm, preferably about 0.5 to 2 mm. As a result, a thickness of fluid 130 is equivalent to the distance 150. The distance of gap 150 can be maintained by holding fixture 120 which retains substrate 110. In another embodiment, holding fixture 120, in addition to retaining substrate 110, is also used to maintain the proper positioning of substrate 110 within fluid 130. Fluid 130 can be loaded into the tray 100 prior to placement of substrate 110. Alternatively, substrate 110 can be positioned in tray 100 and fluid 130 can be mixed and/or added. Fluid 130 can be supplied from conduits near the center of tray 100 and push outward toward the perimeter of the substrate 110. Alternatively, fluid 130 can be supplied from one or more corners or one or more edges of tray 100 and be drawn into the gap 150 between substrate 110 and tray 100 by capillary forces. Tray 100 may be positioned horizontally. Alternatively, tray 100 may be positioned with a slight angle to allow entrapped air and generated gasses to easily escape. Any angle which still permits substantially all of the second surface 116 to remain in contact with fluid 130 by capillary forces is acceptable. Angles below about 20 degrees from horizontal are preferred.

Figure 2:
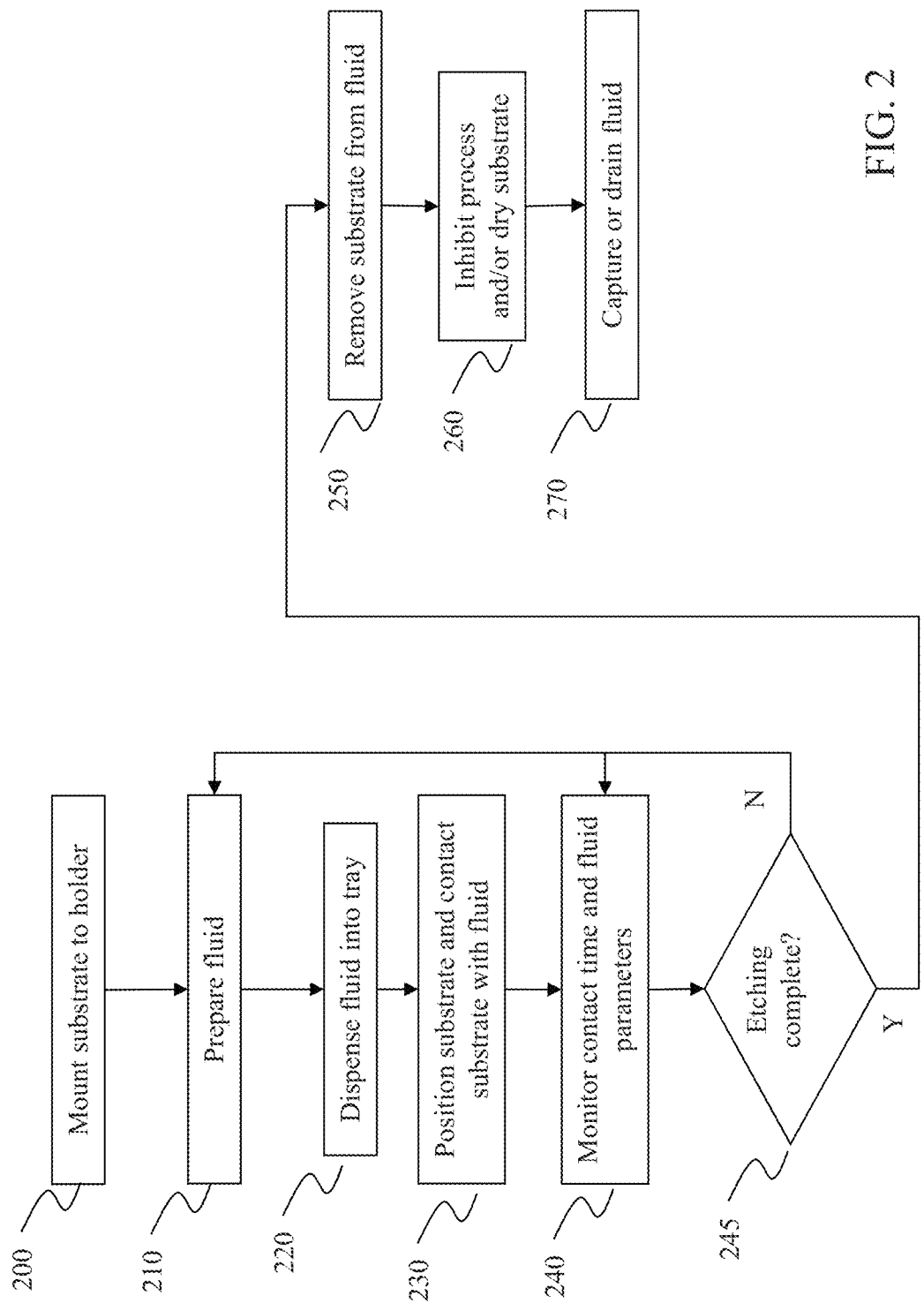
FIG. 2 is an illustrative embodiment of a dip-in method for etching a substrate.

FIG. 2 is an illustrative embodiment of a dip-in method for etching substrate 100. At step 200, substrate 100 is mounted to holder 120. At step 210, fluid 130 is mixed. Fluid 130 can be mixed immediately before use, may be maintained in a mixed condition until use, or may be inline mixed. The small quantity of fluid 130 used during the etching ensures that the mixture will remain homogeneous and will not have micro currents of varying concentrations. In some embodiments, fluid 130 may be comprised of a single active ingredient or may be comprised of multiple ingredients for a single stage or multi-stage etching process. At step 220, fluid 130 is dispensed into tray 100. It may be dispensed via conduits directly into tray 100 or may be dispensed using any other method, including being poured manually into tray 100. At step 230, the substrate 100 is positioned to contact the fluid 130. For example, this may be accomplished by moving tray 100, moving holding fixture 120, or both. This may be accomplished manually, automated, or as part of a larger manufacturing process. The positioning of substrate 110 at step 230 should be such that the distance of gap 150 is accurately maintained to ensure complete contact between the second surface 116 of the substrate to be etched and the fluid. It is also important to position the substrate such that the first surface 113 or any other portion that does not require etching does not contact fluid 130. As step 240, the current stage of a multi-stage etching process, contact time and other parameters may be monitored such as time, temperature, etc. These may be monitored manually or as part of an automated manufacturing process controlled by a computer. Certain parameters, such as time, may be used to trigger or activate steps in an automated process. In step 245, it is determined whether etching is complete based on the monitored parameters in step 240. If etching is not complete, then the process may proceed to the next stages of a multi-stage etching process (e.g. steps 210-240) or monitoring may continue at step 240. For example, when an elapsed time for a step in the etching process has not passed, monitoring may continue in step 240 until a desired etching time has elapsed. As another example, in a multi-stage etching process, it may be determined in step 245 that one stage has been completed, such as a metal catalyst deposition step. As such, the etching process may return to steps 210-240 for the next stages of the multi-stage etching process, such as preparation of the acid and oxidizing agent fluid, dispensing of such fluid, positioning of the substrate in such fluid, and monitoring. After step 245 and prior to a next stage starting with step 210, it may be desirable to prepare the substrate with steps such as rinsing or drying. At step 245, if it is determined that etching is complete the process may move to step 250 where substrate 110 is removed from fluid 130. For example, in a single-stage etching, step 245 may determine completion when a desire etching time has elapse; and in a multi-stage etching, step 245 may evaluate whether a final step of etching is being performed and whether a desired time for the final step has elapsed.

At step 260, the completion of the etching process is stopped either by removing any remaining solution, rinsing the substrate, and/or providing an inhibiting agent, such as a base material(s) including ammonium hydroxide, potassium hydroxide, tetramethylammonium hydroxide, or the like. Substrate 100 may also be dried and prepared for any additional manufacturing steps for completion of the solar cell that might be necessary. At step 270, the fluid 130 may be drained from tray 100 for reuse, disposal, or additional etching of additional substrates. As a nonlimiting example, the fluid 130 may be drained manually or by a conduit or drain built into tray 100.

FIGS. 3a-b depict an embodiment of a system for inverted etching of a substrate 110. This embodiment includes a confinement structure or plate 300, substrate 110, holding fixture 120 and fluid 130. In some embodiments, a plate may be utilized as a dispersion mechanism. Plate 300 may be a flat plate or may have an edge, lip, rim or other boundary around its perimeter. Plate 300 should be larger than substrate 110. Plate 300 may be only slightly larger than a single substrate 110 or may be large enough for several substrates 110 to be placed against it. In some embodiments, plate 300 may be a fixed plate or may be a part of a larger manufacturing assembly that supports an automated process. In some embodiments, plate 300 may be movable to adjust the distance separation with the substrate 110, such as with a plate fixture (not shown) that is analogous to holding fixture 120, or may be retained at a fixed position. In some embodiments, a plate fixture may include a positioning fixture that comprises an actuator, hydraulic actuator, mechanical actuator, or the like that allow the plate 300 to be moved or adjusted as desired. Plate 300 may be composed of an inert material or may be coated with an inert material. As a nonlimiting example, plate 300 may be glass, plastic, metal, or any other inert material. Some plastics used in semiconductor manufacture such as Teflon®, polyvinylidene fluoride (PVDF), or perfluoroalkoxy polymer resins (PFA) have surfaces that do not allow even wetting by water. As a result, the surfaces of plate 300 may be optionally treated by chemical or physical means to render them partially wetting. Nonlimiting examples of such processes are ozone, corona discharge, or oxygen plasma exposures.

Substrate 110 is retained by holding fixture 120 by any known means. Substrate 110 has a first side 116 and a second side 113. First side 116 is the side of substrate 110 that is to be etched. In an embodiment, holding fixture 120 utilizes mechanical means to affix to substrate 110 on the second side 113. Such mechanical means may include, but are not limited to, fingers, clips, fasteners, claws, clamps, and retaining rings that may hold substrate 110 by the perimeter edges or retaining holes. In another embodiment, holding fixture 120 may be attached to the second side 113 of substrate 110 using a temporary adhesive, such as wax, glue, plastic, or paste. In another embodiment, holding fixture 120 may create a vacuum or other force between itself and the second surface 113 of substrate 110 to temporarily retain it. Holding fixture 120 may be retained at a fixed position or may be movable with a position fixture (not shown) coupled to the holding fixture. A positioning fixture may comprise an actuator, hydraulic actuator, mechanical actuator, or the like that allows holding fixture 120 to be moved to position the substrate 110 to adjust and control the separation distance of gap 150. In some embodiments, holding fixture 120 may be positionable to accurately and position and hold substrate 110 with a desired separation distance from plate 300 for the requisite period of time. In contrast to the dip-in embodiments, holding fixture 120 for inverted etching does not need to secure the substrate 110 upside down, thereby allowing for additional embodiments for inverted etching. As a nonlimiting example, holding fixture 120 for inverted etching may include a conveyor, bench top, or the like. In some embodiments, holding fixture 120 may provide a horizontal surface with recesses for receiving substrates.

In some embodiments, the first side 116 of the substrate 110 to be etched is partially masked before contacting the substrate with the fluid 130. The partially masked areas may inhibit or prevent the etching process, thereby providing a resulting substrate that is selectively etched in only certain areas of the substrate. In some embodiments, the etching is used to form a patterned surface on the substrate, such as patterned desired for a selective emitter cell. In some embodiments, the etching is used to remove a top "dead layer," resulting from prior dopant diffusion, in a patterned fashion to produce a selective emitter cell.

Substrate 110 is held with first surface 116 face up and directed toward plate 300. Fluid 130 is placed on the first surface 116 of substrate 110. Fluid 130 is preferably placed on or about the center of substrate 110 with a dispensing mechanism such as conduit 320, although precision placement is not critical. In other embodiments, dispensing mechanism or conduits 320 may be positioned at any other suitable locations, such as edge(s) of plate 300 or substrate 110. In some embodiments, substrate 110 is brought into close proximity with a confinement structure or plate 300, causing fluid 130 to spread over the entire first surface 116 of substrate 110. In some embodiments, plate 300 is brought into close proximity with substrate 110. In yet another embodiment, both substrate and plate 300 may be brought together into close proximity. The desired distance or gap 150 from the substrate 110 to the confinement structure 300 is less than about 5 mm, and preferably about 0.5 to 2 mm. As a result a thickness of fluid 130 is equivalent to the distance 150. The gap 150 may be maintained any mechanism utilized to control the distance between substrate 110 and plate 300, such as holding fixture 120, a position fixture or mechanism (not shown) for positioning plate 300, or a combination thereof. Additionally or alternatively, substrate 110 and plate 300 can be positioned and liquid 130 can be supplied from conduits 320 near the center of plate 300 and pushed outwards. Additionally or alternatively, the liquid 130 can be supplied from one or more corners and/or one or more edges and moved into gap 150 between substrate 110 and the confinement structure or plate 300 by capillary action.

Figure 1B:
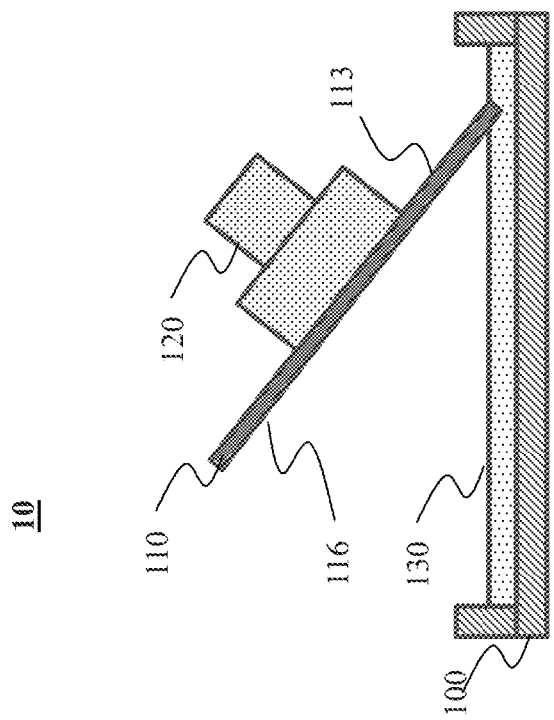

It will be recognized by one of ordinary skill in the art that embodiments discussed with respect to FIGS. 1a-1b, may also be applicable to embodiments discussed with respect to FIGS. 3a-3b. Fluid 130 may be an etching fluid supplied for the black etching. In some embodiments, the substrate 110 may be treated prior to etching with a catalytic metal selected from at least one of gold, silver, copper, platinum, palladium, nickel, vanadium, rhodium, or the like. The catalytic metal may be in the form of a metal nanoparticle or a dissolved salt. In some embodiments, the etching solution may include an acid and an oxidizing agent. The etching solution may provide an acid that is preferably an inorganic acid and most preferably contains fluoride ion. The etching solution may contain an oxidizing agent such as hydrogen peroxide, nitric oxide, or dissolved oxygen. Exposure of the substrate 110 treated with the catalytic metal to the etching solution with the acid and oxidizing agent causes portions with deposits of the metal catalyst to be etched, whereas regions without metal catalyst are not etched. In some embodiment, etching may occur by sequential solution exposures, in which only the first solution contains the catalytic metal and subsequent solution exposures include the acid and/or oxidizing agent. It may be a single mixture fluid or may comprise multiple active ingredients. For example, the inverted etching process utilizing the system shown in FIGS. 3a-3b may be a single-stage or a multi-stage etching process. In some embodiments, substrate 110 may be optionally treated with a first fluid 130 comprising a metal catalyst, and subsequently treated with another fluid 130 comprising an acid and oxidizing agent selected from the embodiments/examples discussed above to complete the etching process. In some embodiments, fluid 130 may comprise a single principle etching solution that contains simultaneously a catalytic metal, an inorganic acid, and an oxidizing species selected from the embodiments/examples discussed above.

Figure 4:
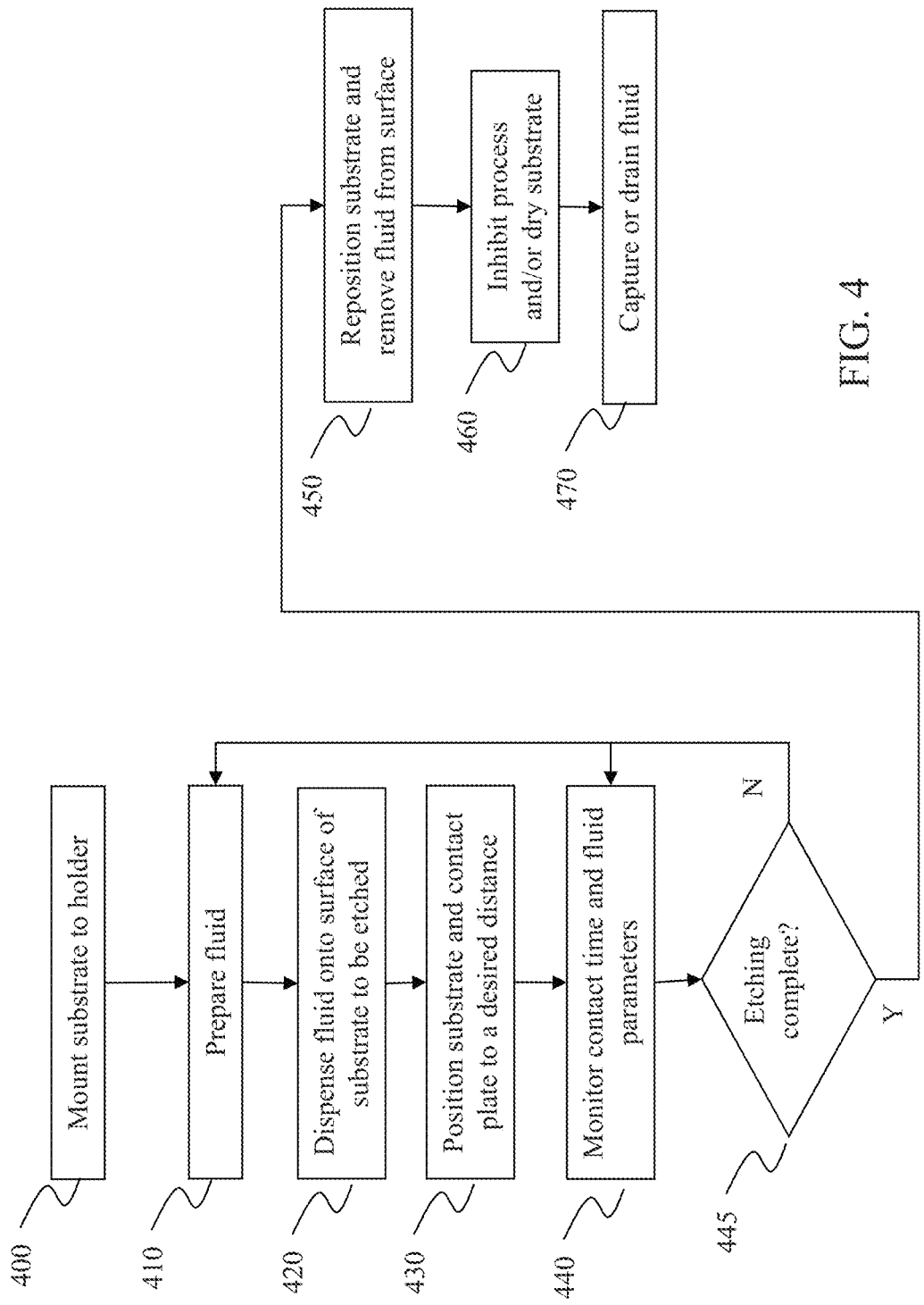
FIG. 4 is an illustrative embodiment of an inverted method for etching a substrate.

FIG. 4 depicts a method for etching substrate 110. At step 400, the rear surface 113 of substrate 110 is mounted to holder 120. At step 410, fluid 130 is mixed. Fluid 130 can be mixed immediately before use or may be maintained in a mixed condition until use. The small quantity of fluid 130 used during the etching ensures that the mixture will remain homogeneous and will not have micro currents of varying concentrations. During step 410, fluid 130 may be inline mixed, may comprise a single active ingredient or may be comprised of multiple ingredients. At step 420, fluid 130 is dispensed onto the front surface 116 of substrate 110. It may be dispensed via conduits directly onto the front surface 116 or may be dispensed using any other method, including being poured manually the front surface 116. At step 430, the substrate 110 and contact plate 300 are positioned at a desired distance separation such that fluid 130 on the first surface 116 of substrate 110 also contacts plate 300. The contact of fluid 130 to plate 300 causes fluid 130 to spread across the first surface 116 of substrate 110. This may be accomplished by moving the contacting surface or plate 300, the holding fixture 120, or both. This may be accomplished manually or as part of a larger automated manufacturing process. The positioning of substrate 110 at step 430 should be such that the distance of gap 150 is accurately maintained to ensure complete contact between the fluid 130 and the plate 300. In another embodiment, the order of steps 420 and 430 may be reversed such that the substrate 110 is positioned prior to the dispensing of the fluid. In this manner, the fluid may be dispensed via a conduit 320 or may be dispensed along the perimeter edges of substrate 110 and drawn onto the front surface 116 by capillary action.

In either case, it is important to position the substrate such that the fluid is evenly distributed within gap 150 and fully contacts the first surface 116 of substrate 110. At step 440 the current stage of a multi-stage etching, contact time, and other parameters may be monitored such as time, temperature, etc. These may be monitored manually or as part of an automated manufacturing process controlled by a computer. Certain parameters, such as time, may be used to trigger or activate steps in an automated process. At step 445 if it is determined whether etching is complete. If etching is complete, the process may move to step 450 where the gap 150 is increased to a point where fluid 130 no longer contacts plate 300. For example, if the etching is a single-stage process etching may be completed once a desired etching time has elapsed.

If etching is not complete, then a next stage of etching (e.g. steps 410-440) or monitoring continues to step 440. For example, when an elapsed time for a step in the etching process has not passed, monitoring may continue to step 440 until a desired etching time has elapsed. As another example, in a multi-stage etching process, it may be determined in step 445 that one stage has been completed, such as a metal catalyst deposition step. As such, the etching process may return to steps 410-440 for the next stages of the multi-stage etching process, such as preparation of the acid and oxidizing agent fluid, dispensing of such fluid, positioning of the substrate in such fluid, and monitoring. At step 460, the etching process is stopped either by removing any remaining solution from the front surface 116 or by providing an inhibiting agent such as a basic materials (e.g., ammonium hydroxide, potassium hydroxide, tetramethylammonium hydroxide, or the like). Substrate 110 may then be dried and prepared for any additional manufacturing steps for completion of the solar cell that might necessary. At step 470, fluid 130 may be collected for reuse or may be disposed of. The fluid may be siphoned off the surface of the substrate 110 or drained manually or by a conduit.

Figure 5A:
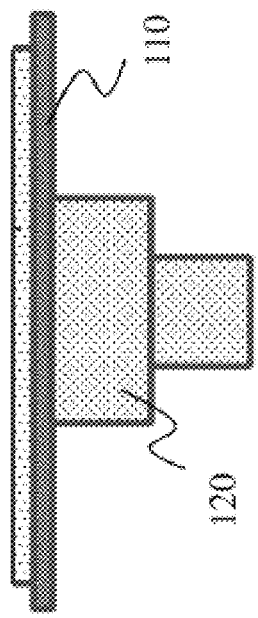
FIGS. 5a-5c are an illustrative embodiments of a system for coating/spray etching of a substrate, and a coating/spray method for etching a substrate.
Figure 5B:
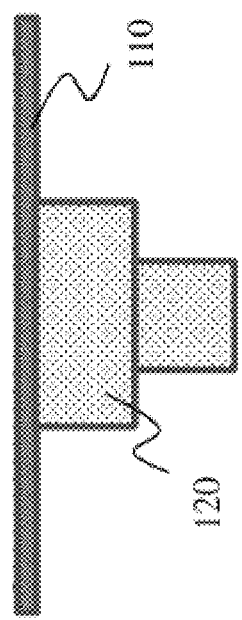

FIGS. 5a-5b depict a system for coating/spray etching of a substrate 110. Holding fixture 120 is used to secure and/or retain substrate 110. In some embodiments, the etching solution or fluid 130 can be applied by coating or spraying the fluid 130 onto substrate 110 in a thin layer with a dispensing mechanism (not shown) without the use of a tray 100 or plate 300. In some embodiments, the dispensing mechanism may be a nozzle, sprayer, doctor blade, hopper coating (like doctor blade but fluid supplied from within via a slit) printer, spin coater, or the like. In this embodiment, the substrate 110 may be retained in a horizontal position and the fluid 130 can be applied to the top or the bottom surface. The fluid 130 remains in position for a set period of time due to surface forces and/or the fluid's viscosity. The final thickness of fluid 130 on the substrate 100 is equal to or less than 1.5 mm, and preferably about 1 mm or less. The fluid 130 may be applied and spread utilizing a coating process such as blade coating, bead coating, curtain coating, nozzle spray coating, ultrasonic atomization spray coating, or the like. The substrate 110 may then be placed in a confinement structure to prevent fluid 130 from draining off the substrate or to allow the thickness of fluid 130 to pool on the substrate 110. In some embodiments, holding fixture 120 may be temporarily affixed to the back surface of substrate 110 such as a silicon wafer. Holding fixture 120 may comprise a single piece or multiple pieces and may be affixed in any number of ways. In an embodiment, holding fixture 120 utilizes mechanical means to affix to substrate 110 on the side of substrate 110 that is not to be etched. Such mechanical means may include, but are not limited to, fingers, clips, fasteners, claws, clamps, and retaining rings that may hold substrate 110 by the perimeter edges or retaining holes. In another embodiment, holding fixture 120 may be attached to the substrate 110 using a temporary adhesive, such as wax, glue, plastic, or paste. In another embodiment, holding fixture 120 may create a vacuum or other force between itself and the surface of substrate 110 to temporarily retain it. Holding fixture 120 may be sized to be used manually or may be part of an automated manufacturing process. Holding fixture 120 may be retained at a fixed position or may be movable with a position fixture (not shown) coupled to the holding fixture. A positioning fixture may comprise an actuator, hydraulic actuator, mechanical actuator, or the like that allows holding fixture 120 to be moved to position the substrate 110 as desired. In contrast to the dip-in embodiments, holding fixture 120 for coating/spray etching does not need to secure the substrate 110 upside down, thereby allowing for additional embodiments that do not need to hold up the weight of the substrate in an upside down position. As a nonlimiting example, holding fixture 120 for coating/spray etching may include a conveyor, bench top, or the like.

Fluid 130 may be an etching fluid supplied for the black etching. In some embodiments, the substrate 110 may be treated prior to etching with a catalytic metal selected from at least one of gold, silver, copper, platinum, palladium, nickel, vanadium, rhodium, or the like. The catalytic metal may be in the form of a metal nanoparticle or a dissolved salt. In some embodiments, the etching solution may include an acid and an oxidizing agent. The etching solution may provide an acid that is preferably an inorganic acid and most preferably contains fluoride ion. The etching solution may contain an oxidizing agent such as hydrogen peroxide, nitric oxide, or dissolved oxygen. Exposure of the substrate 110 treated with the catalytic metal to the etching solution with the acid and oxidizing agent causes portions with deposits of the metal catalyst to be etched, whereas regions without metal catalyst are not etched. In some embodiment, etching may occur by sequential solution exposures, in which only the first solution contains the catalytic metal and subsequent solution exposures include the acid and/or oxidizing agent. It may be a single mixture fluid or may comprise multiple active ingredients. For example, the inverted etching process utilizing the system shown in FIGS. 3a-3b may be a single-stage or a multi-stage etching process. In some embodiments, substrate 110 may be optionally treated with a first fluid 130 comprising a metal catalyst, and subsequently treated with another fluid 130 comprising an acid and oxidizing agent selected from the embodiments/examples discussed above to complete the etching process. In some embodiments, fluid 130 may comprise a single principle etching solution that contains simultaneously a catalytic metal, an inorganic acid, and an oxidizing species selected from the embodiments/examples discussed above.

In an embodiment, higher viscosity and lower surface tension fluid may be useful. This is especially true for embodiments where the fluid 130 is applied directly to the substrate without tray 100 or plate 300. In an embodiment, the viscosity should be about 1 cP to 100 cP, preferably about 2 cP to 10 cP. The surface tension should be about 20 to 70 dyn/cm, preferably about 25 to 50 dyn/cm. In an embodiment, fluid 130 may have a viscosity of about 1 cP and a surface tension of about ~70 dyn/cm.

In an embodiment, fluid 130 comprises multiple components and mixed inline prior to dispensing into tray 100 or onto front surface 310. Inline mixing may occur in conduit 320 or may be done at any point along the process.

Figure 5C:
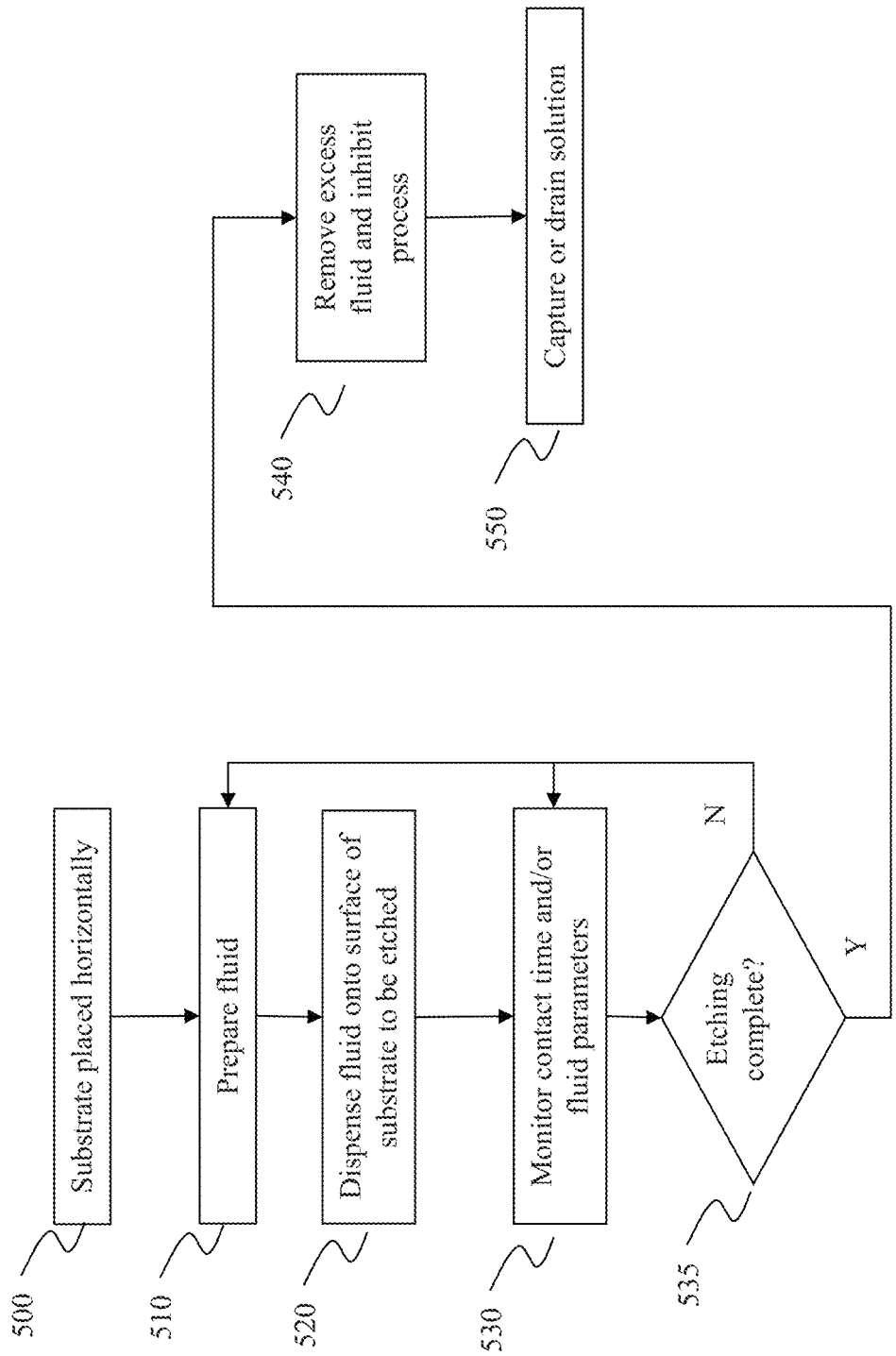

FIG. 5c depicts a method for etching substrate 110. At step 500, substrate 110 is placed horizontally wither in a holder similar to holder 120 or placed on a surface such as a bench top or conveyor belt. At step 510 fluid 130 is mixed. Fluid 130 can be mixed immediately before use or may be maintained in a mixed condition until use. The small quantity of fluid 130 used during the etching ensures that the mixture will remain homogeneous and will not have micro currents of varying concentrations. During step 510, fluid 130 may be inline mixed, may comprise a single active ingredient or may be comprised of multiple ingredients. At step 520, fluid 130 is dispensed onto the surface of substrate 110 to be etched. It may be dispensed by blade coating, bead coating, curtain coating, nozzle spray coating, or ultrasonic atomization spray coating or any other method that dispenses a thin homogeneous layer. At step 530 the current stage of a multi-stage etching, contact time, and other fluid parameters may be monitored such as time, temperature, etc. These may be monitored manually or as part of an automated manufacturing process. Certain parameters, such as time, may be used to trigger or activate steps in an automated process. At step 535 if it is determined whether etching is complete. If etching is not complete, then a next stage of etching (e.g. steps 510-530) or monitoring continues to step 530. For example, when an elapsed time for a step in the etching process has not passed, monitoring may continue to step 530 until a desired etching time has elapsed. As another example, in a multi-stage etching process, it may be determined in step 535 that one stage has been completed, such as a metal catalyst deposition step. As such, the etching process may return to steps 510-530 for the next stages of the multi-stage etching process, such as preparation of the acid and oxidizing agent fluid, dispensing of such fluid, positioning of the substrate in such fluid, and monitoring. If the etching is complete, the process may move to step 540 where the etching process is stopped either by removing the solution from the surface, diluting the solution on the surface, and/or by providing an inhibiting agent such as a basic materials (e.g., ammonium hydroxide, potassium hydroxide, tetramethylammonium hydroxide, or the like). Removal of the fluid may occur by directing a flow of a diluent or an inhibitor at the surface of the substrate. In some embodiments, the flow may be an impingement flow or a flow directed at a specific angle. In some embodiments, the flow of the diluent or inhibitor may be provided from a small jet, nozzle, or the like. Preferably the flow is uniform across the width of the substrate. The diluent may be a solvent such as water, methanol, or isopropanol. Substrate 110 may then be dried and prepared for any additional manufacturing steps that might necessary to complete the solar cell. At step 550 any excess fluid 130 may be collected for reuse or may be disposed of. The fluid may be siphoned off the surface of the substrate 110 or drained manually or by a conduit.

It will be recognized by one of ordinary skill in the art that some of the components discussed for each embodiment may be suitable for use with any of the disclosed embodiments. As nonlimiting examples, the substrate(s), fluid(s), holding fixture(s), or the like may be utilized with any of the embodiments discussed herein. In any of the disclosed embodiments, it is to be understood by those skilled in the art that the substrates can be processed serially on a belt system with several substrates processed at a time in an assembly line fashion or one at a time.

FIG. 6 depicts a general computer architecture on which the present teaching can be implemented and has a functional block diagram illustration of a computer hardware platform that includes user interface elements. The computer may be a general-purpose computer or a special purpose computer. This computer 600 can be used to implement any steps of the process as described herein. It may be used to control the positioning of the substrates, the locations of the holding fixtures, the monitoring of times and temperatures and any other step or process that may be automated. Different steps can all be implemented on one or more computers such as computer 600, via its hardware, software program, firmware, or a combination thereof. Although only one such computer is shown, for convenience, the methods disclosed herein may be implemented in a distributed fashion on a number of similar platforms, to distribute the processing load.

The computer 600, for example, includes COM ports 602 connected to and from a network connected thereto to facilitate data communications. The computer 600 also includes a central processing unit (CPU) 604, in the form of one or more processors, for executing program instructions. The exemplary computer platform includes an internal communication bus 606, program storage and data storage of different forms, e.g., disk 608, read only memory (ROM) 610, or random access memory (RAM) 612, for various data files to be processed and/or communicated by the computer, as well as possibly program instructions to be executed by the CPU. The computer 600 also includes an I/O component 614, supporting input/output flows between the computer and other components therein such as user interface elements 616. The computer 600 may also receive programming and data via network communications.

Hence, aspects of the method disclosed herein, as outlined above, may be embodied in programming. All or portions of the software may at times be communicated through a network such as the Internet or various other telecommunication networks.

Those skilled in the art will recognize that the present teachings are amenable to a variety of modifications and/or enhancements. For example, although the implementation of various steps may be performed manually, they may also be implemented as part of an automated process and carried out by a computer or other automation operation.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

Embodiments described herein are included to demonstrate particular aspects of the present disclosure. It should be appreciated by those of skill in the art that the embodiments described herein merely represent exemplary embodiments of the disclosure. Those of ordinary skill in the art should, in light of the present disclosure, appreciate that many changes can be made in the specific embodiments described and still obtain a like or similar result without departing from the spirit and scope of the present disclosure. From the foregoing description, one of ordinary skill in the art can easily ascertain the essential characteristics of this disclosure, and without departing from the spirit and scope thereof, can make various changes and modifications to adapt the disclosure to various usages and conditions. The embodiments described hereinabove are meant to be illustrative only and should not be taken as limiting of the scope of the disclosure.

The invention claimed is:

1. A method for anti-reflective etching the surface of a substrate, the method comprising:
   securing the substrate with a holding fixture, wherein the holding fixture controls positioning of the substrate;
   preparing a fluid, wherein the fluid comprises an acid and an oxidizer;
   dispensing the fluid, wherein the fluid is dispensed into a tray, and the fluid contacts the substrate after being dispensed;
   spreading the fluid onto the substrate into a thin layer with a thickness of 5 mm or less, wherein the fluid is dispersed into the thin layer with the thickness by positioning the first surface of the substrate a predetermined distance from a bottom surface of the tray without submerging the substrate in the fluid, the fluid is spread by moving the substrate into the tray, moving the tray toward the substrate, or a combination thereof, the substrate enters the fluid at an angle of 20 to 60 degrees, the thin layer contacts a first surface of the substrate for a predetermined time, and the thickness of the fluid is controlled by controlling a separation distance between the first surface of the substrate and an opposing surface of a dispersion mechanism opposite the first surface, and the fluid is not in contact with a second surface of the substrate opposite the first surface; and removing the thin layer of fluid from the substrate, wherein the first surface of the substrate has reduced reflectivity.

2. The method of claim 1, wherein a metal catalyst is deposited on the substrate prior to the anti-reflective etching.

3. The method of claim 1, further comprising:

preparing a deposition fluid, wherein the deposition fluid comprises a metal catalyst;

dispensing the deposition fluid, wherein the deposition fluid contacts the substrate after being dispensed;

spreading the deposition fluid onto the substrate into a deposition layer, wherein the deposition layer contacts the first surface of the substrate for a predetermined deposition time; and removing the deposition layer of deposition fluid from the substrate, wherein the metal catalyst is deposited on portions of the substrate.

4. The method of claim 1, wherein the fluid further comprises a metal catalyst.

5. The method of claim 1, wherein components of the fluid are mixed in an inline manner in a conduit prior to the dispensing step.

6. The method of claim 1, wherein the fluid remains in contact with the substrate for 10 second to 5 minutes.

7. The method of claim 1, wherein the fluid is dispensed by capillary forces.

8. The method of claim 1, wherein the substrate is masked prior to the anti-reflective etching.

* * * * *